(12) United States Patent
Chen et al.

(10) Patent No.: US 9,897,881 B2
(45) Date of Patent: Feb. 20, 2018

(54) THIN FILM TRANSISTOR ARRAY SUBSTRATE AND LIQUID CRYSTAL DISPLAY PANEL

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Gui Chen, Guangdong (CN); Caiqin Chen, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 79 days.

(21) Appl. No.: 14/902,551

(22) PCT Filed: Sep. 23, 2015

(86) PCT No.: PCT/CN2015/090330
§ 371 (c)(1),
(2) Date: Dec. 31, 2015

(87) PCT Pub. No.: WO2017/035880
PCT Pub. Date: Mar. 9, 2017

(65) Prior Publication Data
US 2017/0235170 A1 Aug. 17, 2017

(30) Foreign Application Priority Data

Aug. 28, 2015 (CN) .......................... 2015 1 0540298

(51) Int. Cl.
*H01L 27/12* (2006.01)
*G02F 1/1368* (2006.01)
(Continued)

(52) U.S. Cl.
CPC ........ *G02F 1/1368* (2013.01); *G02F 1/13439* (2013.01); *G02F 1/134309* (2013.01);
(Continued)

(58) Field of Classification Search
CPC ................. H01L 27/12; H01L 27/1214; H01L 27/14612; H01L 27/3262; G02F 1/13439; G02F 1/136209
See application file for complete search history.

(56) References Cited

U.S. PATENT DOCUMENTS

2002/0033914 A1* 3/2002 Yoo ................... G02F 1/133512
349/110
2005/0247939 A1* 11/2005 Iketsu ................. H01L 51/5221
257/66
(Continued)

FOREIGN PATENT DOCUMENTS

CN 102411237 A 4/2012
CN 103268047 A 8/2013
(Continued)

*Primary Examiner* — Phuc Dang
(74) *Attorney, Agent, or Firm* — Andrew C. Cheng

(57) ABSTRACT

The present invention provides a thin film transistor array substrate and a liquid crystal display panel. The thin film transistor array substrate comprises: a substrate; a light shielding layer, located at a middle part on a surface of the substrate; a buffer layer, covering the light shielding layer; a Low Temperature Poly-silicon layer, being located on the buffer layer, and corresponding to the light shielding layer; an isolation layer, covering the Low Temperature Poly-silicon layer, and the isolation layer comprises a through hole, wherein a width of the through hole is smaller than a width of the light shielding layer; a metal layer, located on the isolation layer, and the metal layer is connected with the Low Temperature Poly-silicon layer via the through hole.
(Continued)

The thin film transistor array substrate and the liquid crystal display panel have a higher aperture ratio.

18 Claims, 2 Drawing Sheets

(51) Int. Cl.
   *G02F 1/1362* (2006.01)
   *G02F 1/1343* (2006.01)
   *H01L 29/786* (2006.01)

(52) U.S. Cl.
   CPC .. *G02F 1/136209* (2013.01); *G02F 1/136286* (2013.01); *G02F 2001/13685* (2013.01); *G02F 2201/121* (2013.01); *G02F 2201/123* (2013.01); *G02F 2202/104* (2013.01); *H01L 29/78633* (2013.01)

(56) References Cited

U.S. PATENT DOCUMENTS

| | | | |
|---|---|---|---|
| 2008/0055503 A1 | 3/2008 | Cheng | |
| 2010/0171128 A1* | 7/2010 | Brown | G02F 1/13318 257/84 |
| 2013/0037870 A1* | 2/2013 | Furukawa | G02F 1/136209 257/288 |

FOREIGN PATENT DOCUMENTS

| | | |
|---|---|---|
| CN | 104460157 A | 3/2015 |
| CN | 104503172 A | 4/2015 |
| CN | 104538400 A | 4/2015 |

* cited by examiner

10

THIN FILM TRANSISTOR ARRAY SUBSTRATE AND LIQUID CRYSTAL DISPLAY PANEL

CROSS REFERENCE

This application claims the priority of Chinese Patent Application No. 201510540298.X, entitled "Thin film transistor array substrate and liquid crystal display panel", filed on Aug. 28, 2015, the disclosure of which is incorporated herein by reference in its entirety.

FIELD OF THE INVENTION

The present invention relates to a display panel technology field, and more particularly to a thin film transistor array substrate and a liquid crystal display panel.

BACKGROUND OF THE INVENTION

The liquid crystal display panel is a common display device, and possesses properties of low power consumption, small volume and light weight. Therefore, it has been favored by the users. With the development of the flat display technology, the requirement of the liquid crystal display panel with high pixels and lower power consumption has been proposed. The electron mobility of the amorphous silicon is lower, and the Low Temperature Ploy-silicon (LTPS) can be manufactured at low temperature, and possesses higher electron mobility than that of the amorphous silicon. Second, the switch manufactured by Low Temperature Ploy-silicon can be applied in the liquid crystal display panel having higher resolution and low power consumption. Therefore, the Low Temperature Ploy-silicon has been widely applied and researched. At present, the liquid crystal display of high pixel based on LTPS demands accurate manufacture process and optimized pixel design. The width of the data line in the pixel design is an important consideration index. The data line with a smaller width can raise the aperture ratio, and accordingly, the design requirement of the through hole for connecting the data line with the Low Temperature Ploy-silicon layer is also raised. The data line with smaller width in design is required. However, the source connected with the data line needs the through hole for connecting with the Low Temperature Ploy-silicon layer. The through hole is restricted by the limitation of the stepper and cannot be smaller in process. For preventing the light leakage issue caused by that the through hole is over large as etching the through hole, the widths of the data line, source and the Low Temperature Ploy-silicon layer at the position of the through hole are generally larger than the widths of the data line, source and the Low Temperature Ploy-silicon layer at the positions except the through hole. However, the aperture ratio of the liquid crystal display is influenced. Moreover, the electrical field of the data line, source and the Low Temperature Ploy-silicon layer at the position of the through hole will influence the leading direction of the liquid crystals, a wider black matrix layer located on the color filter substrate is required for shielding, and the aperture ratio of the liquid crystal display applied with the liquid crystal display can be promoted in advance.

SUMMARY OF THE INVENTION

The present invention provides a thin film transistor array substrate, and the thin film transistor array substrate comprises:

a substrate;

a light shielding layer, located at a middle part on a surface of the substrate;

a buffer layer, covering the light shielding layer;

a Low Temperature Poly-silicon layer, being located on the buffer layer, and corresponding to the light shielding layer;

an isolation layer, covering the Low Temperature Poly-silicon layer, and the isolation layer comprises a through hole, wherein a width of the through hole is smaller than a width of the light shielding layer;

a metal layer, located on the isolation layer, and the metal layer is connected with the Low Temperature Poly-silicon layer via the through hole.

The isolation layer is a gate isolation layer.

The metal layer comprises a data line and a source connected to the data line, and widths at respective positions of the metal layer are equal, and a part of the source is located close to the data line in accordance with the through hole, and is connected to the Low Temperature Poly-silicon layer via the through hole.

A width of the light shielding layer is larger than a width of the metal layer, and a width of the light shielding layer is larger than or equal to a width of the through hole.

Material of the light shielding layer is metal.

Material of the light shielding material comprises Mo.

The thin film transistor array substrate comprises a thin film transistor, and the thin film transistor comprises the Low Temperature Poly-silicon layer, the isolation layer and the metal layer, and the thin film transistor is a top gate thin film transistor or a bottom gate thin film transistor.

The thin film transistor array substrate further comprises:

a flat layer, covering the metal layer;

a first transparent conductive layer, covering the flat layer;

a passivation layer, covering the first transparent conductive layer;

a second transparent conductive layer, covering the passivation layer.

The first transparent conductive layer is a pixel electrode, and the second transparent conductive layer is a common electrode layer.

The present invention further provides a liquid crystal display panel, and the liquid crystal display panel comprises the thin film transistor array substrate described in any of the aforesaid embodiments.

Compared with prior art, in the thin film transistor array substrate of the present invention and the liquid crystal display comprising the thin film transistor array substrate, one light shielding layer is located at the center on the surface of the substrate, and the Low Temperature Poly-silicon layer is located corresponding to the light shielding layer through one buffer layer, and the isolation layer covers the Low Temperature Poly-silicon layer and the isolation layer comprises the through hole, and the width of the through hole is smaller than the width of the light shielding layer, and the metal layer is located on the isolation layer, and the metal layer is connected with the Low Temperature Poly-silicon layer via the through hole. Thus, the light shielding layer is located on the surface of the substrate in the thin film transistor array substrate of the present invention, and the light shielding layer is isolated from the Low Temperature Poly-silicon layer and the metal layer with the buffer layer. Therefore, the arrangement of the light shielding layer does not cause the electrical field effect, and does not influence the leading direction of the liquid crystals. Accordingly, it is beneficial for promoting the aperture ratio of the liquid crystal display applied with the thin film transistor array substrate. Furthermore, because the thin film transistor array substrate of the present invention does not influence the leading direction of the liquid crystals, a wider black matrix layer located on the color filter substrate is not required for shielding in the thin film transistor array substrate of the present invention, and the aperture ratio of the liquid crystal display applied with the thin film transistor array substrate can be promoted in advance.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
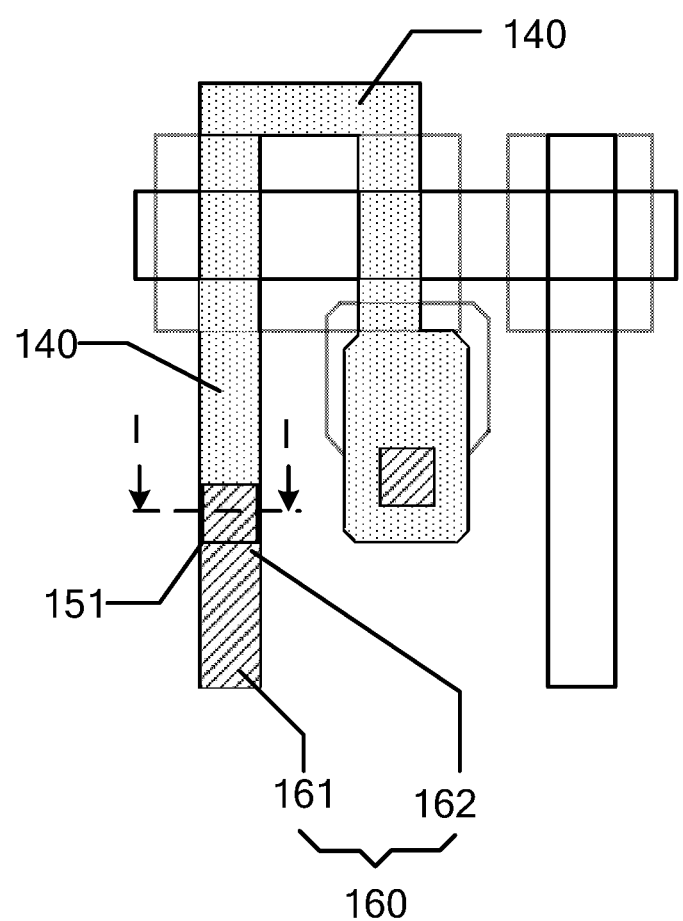
FIG. 1 is a plane structure diagram of a thin film transistor array substrate according to one preferred embodiment of the present invention.
Figure 2:
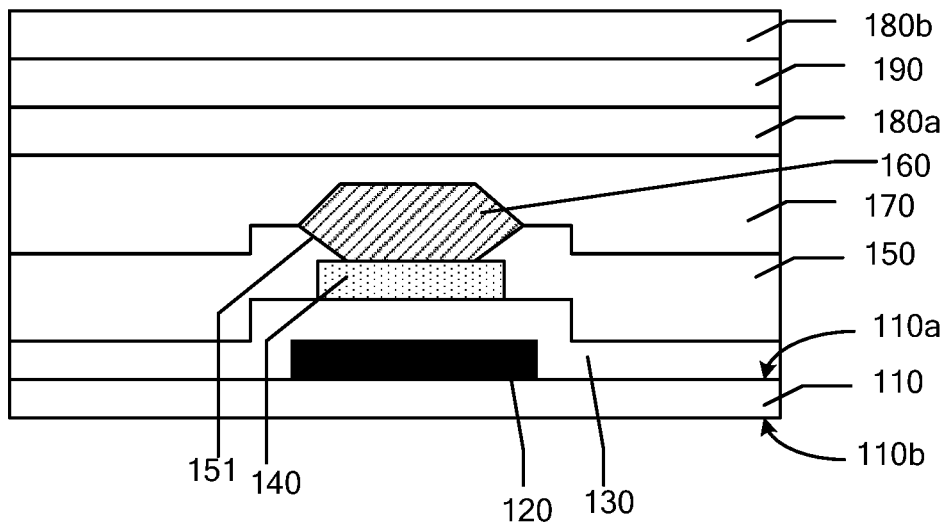
FIG. 2 is a sectional structure diagram along I-I line in FIG. 1.

Please refer to FIG. 1 and FIG. 2, together. FIG. 1 is a plane structure diagram of a thin film transistor array substrate according to one preferred embodiment of the present invention. FIG. 2 is a sectional structure diagram along I-I line in FIG. 1. The thin film transistor array substrate 100 comprises a substrate 110, a light shielding layer 120, a buffer layer 130, a Low Temperature Poly-silicon layer 140, an isolation layer 150 and a metal layer 160. The light shielding layer 120 is located at a middle part on a surface of the substrate 110, and the buffer layer 130 covers the light shielding layer 120, and the Low Temperature Poly-silicon layer 140 is located on the buffer layer 130, and corresponds to the light shielding layer 120. The isolation layer 150 covers the Low Temperature Poly-silicon layer 140, and the isolation layer 150 comprises a through hole 151, wherein a width of the through hole 151 is smaller than a width of the light shielding layer 120. The metal layer 160 is located on the isolation layer 150, and the metal layer 160 is connected with the Low Temperature Poly-silicon layer 140 via the through hole 151.

The thin film transistor array substrate 100 comprises a thin film transistor, and the thin film transistor comprises the Low Temperature Poly-silicon layer 140, the isolation layer 150 and the metal layer 160, and the thin film transistor is a top gate thin film transistor or a bottom gate thin film transistor. The thin film transistor comprises a gate, a source and a drain. The gate is employed to receive a control signal, and the gate controls the source and the drain to be on or off under control of the control signal. When the gate controls the source and the drain to be on under control of the control signal, the source and the drain are electrically coupled, and an electrical path between the source and the drain is formed, and the thin film transistor is activated. When the gate controls the source and the drain to be off under control of the control signal, the source and the drain are cut off, and no electrical path can be formed between the source and the drain, and the thin film transistor is off (i.e. deactivated).

The substrate 110 is transparent, and the substrate 110 can be but not be restricted to be a plastic substrate or a glass substrate. The substrate 110 comprises a first surface 110a and a second surface 110b which are oppositely located, and that the light shielding layer 120 is located on the surface of the substrate 110 can be that the light shielding layer 120 is located on the first surface 110a of the substrate 110, or can be that the light shielding layer 120 is located on the second surface 110b of the substrate 110. Next, it is illustrated that the shielding layer 120 is located on the first surface 110a of the substrate 110 for explanation.

The light shielding layer 120 is located at a middle part on a surface of the substrate 110, i.e. the light shielding layer 120 is located at the middle part on the first surface 110a of the substrate 110. The light shielding layer 120 is employed to prevent the light leakage toward the direction of the second surface 110b of the substrate 110 by the thin film transistor in the thin film transistor array substrate. In one embodiment, material of the light shielding layer 120 can be metal. The material of the light shielding layer 120 can be Mo but not limited thereto. A width of the light shielding layer 120 is larger than a width of the metal layer 160, and a width of the light shielding layer 120 is larger than or equal to a width of the through hole 151. The width of the through hole 151 is restricted by the smallest width manufactured according to the limitation of the photo stepper. The width of the light shielding layer 120 is larger than the width of the metal layer 160, and smaller than the widths of the data line, source at the through hole connection position mentioned in background. The width of the metal layer 160 is larger than or equal to a width of the through hole 151, and smaller than the widths of the data line, source at the through hole connection position mentioned in background.

The buffer layer 130 is located between the light shielding layer 120 and the Low Temperature Poly-silicon layer 140, and employed to electrically isolate the light shielding layer 120 and the Low Temperature Poly-silicon layer 140. The buffer layer 130 is also employed to buffer the damage to the substrate 110 during the manufacture process of the thin film transistor array substrate 100.

The Low Temperature Poly-silicon layer 140 is located on the buffer layer 130, and corresponds to the light shielding layer 120. Here, the correspondence of the Low Temperature Poly-silicon layer 140 and the light shielding layer 120 refers to that the projection of the Low Temperature Poly-silicon layer 140 on the first surface 110a of the substrate 110 falls in the projection of the light shielding layer 120 on the first surface 110a of the substrate 110. For convenience, the projection of the Low Temperature Poly-silicon layer 140 on the first surface 110a of the substrate 110 is named to be a first projection, and the projection of the light shielding layer 120 on the first surface 110a of the substrate 110 is named to be a second projection. In one embodiment, the first projection falls in the second projection, and the center of the first projection coincides with the center of the second projection. In other embodiment, the first projection falls in the second projection, and the center of the first projection does not coincide with the center of the second projection, and the edge of the first projection and the edge of the second projection do not coincide. In other embodiment, the first projection falls in the second projection, and the center of the first projection does not coincide with the center of the second projection, and the edge of the first projection and the edge of the second projection partially coincide.

The isolation layer 150 is a gate isolation layer. The material of the isolation layer 150 can be oxide of silicon (such as SiO2), nitrogen and silicon compounds (SiNx, wherein x is a natural number of nitrogen which can form the nitrogen and silicon compound, and x can be 4 for example) and etc.

The metal layer 160 is located on the isolation layer 150, and the metal layer 160 is connected with the Low Temperature Poly-silicon layer 140 via the through hole 151. The metal layer 160 comprises a data line 161 and a source 162 connected to the data line 161, and widths at respective positions of the metal layer are equal, and a part of the source 162 is located close to the data line 161 in accordance with the through hole 151, and is connected to the Low Temperature Poly-silicon layer 140 via the through hole 151.

The thin film transistor array substrate 100 further comprises a flat layer 170, a first transparent conductive layer 180a, a passivation layer 190 and a second transparent conductive layer 180b. The flat layer 170 covers the metal layer 160, and the first transparent conductive layer 180a covers the flat layer 170, and the passivation layer 190 covers the first transparent conductive layer 180a, and the second transparent conductive layer 180b covers the passivation layer 190. In one embodiment, the flat layer 170 is an organic flat layer, and the first transparent conductive layer 180a can be Indium Tin Oxide (ITO) but not limited thereto, and the second transparent conductive layer 180b can be Indium Tin Oxide (ITO) but not limited thereto, and material of the passivation layer 190 can be oxide of silicon (such as SiO2), nitrogen and silicon compounds, and etc. In one embodiment, the first transparent conductive layer 180a is a pixel electrode, and the second transparent conductive layer 180b is a common electrode layer.

Compared with prior art, in the thin film transistor array substrate 100 of the present invention, one light shielding layer 120 is located at the center on the surface of the substrate 110, and the Low Temperature Poly-silicon layer 140 is located corresponding to the light shielding layer 120 through one buffer layer 130, and the isolation layer 150 covers the Low Temperature Poly-silicon layer 140 and the isolation layer 150 comprises the through hole 151, and the width of the through hole 151 is smaller than the width of the light shielding layer 120, and the metal layer 160 is located on the isolation layer 150, and the metal layer 160 is connected with the Low Temperature Poly-silicon layer 140 via the through hole 140. Thus, the light shielding layer 120 is located on the surface of the substrate 110 in the thin film transistor array substrate 100 of the present invention, and the light shielding layer 120 is isolated from the Low Temperature Poly-silicon layer 140 and the metal layer 160 with the buffer layer 130. Therefore, the arrangement of the light shielding layer 120 does not cause the electrical field effect, and does not influence the leading direction of the liquid crystals. Accordingly, it is beneficial for promoting the aperture ratio of the liquid crystal display applied with the thin film transistor array substrate 100. Furthermore, because the thin film transistor array substrate 100 of the present invention does not influence the leading direction of the liquid crystals, a wider black matrix layer located on the color filter substrate is not required for shielding in the thin film transistor array substrate 100 of the present invention, and the aperture ratio of the liquid crystal display applied with the thin film transistor array substrate 100 can be promoted in advance.

Figure 3:
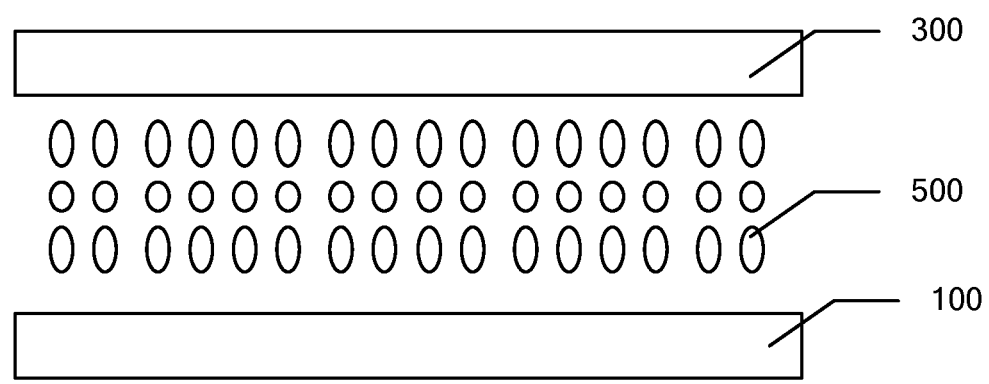
FIG. 3 is a plane structure diagram of a liquid crystal display panel according to one preferred embodiment of the present invention.

With combination of FIG. 1 and FIG. 2, the liquid crystal display of the present invention is introduced. Please refer to FIG. 3. FIG. 3 is a plane structure diagram of a liquid crystal display panel according to one preferred embodiment of the present invention. The liquid crystal display panel 10 comprises the thin film transistor array substrate 100 in FIG. 1 and FIG. 2, and the liquid crystal display panel 10 further comprises a color filter substrate 300 and a liquid crystal layer 500. The thin film transistor array substrate 100 and the color filter substrate 300 are oppositely located, and the liquid crystal layer 500 is located between the thin film transistor array substrate 100 and the color filter substrate 300.

The thin film transistor array substrate 100 comprises a substrate 110, a light shielding layer 120, a buffer layer 130, a Low Temperature Poly-silicon layer 140, an isolation layer 150 and a metal layer 160. The light shielding layer 120 is located at a middle part on a surface of the substrate 110, and the buffer layer 130 covers the light shielding layer 120, and the Low Temperature Poly-silicon layer 140 is located on the buffer layer 130, and corresponds to the light shielding layer 120. The isolation layer 150 covers the Low Temperature Poly-silicon layer 140, and the isolation layer 150 comprises a through hole 151, wherein a width of the through hole 151 is smaller than a width of the light shielding layer 120. The metal layer 160 is located on the isolation layer 150, and the metal layer 160 is connected with the Low Temperature Poly-silicon layer 140 via the through hole 151.

The thin film transistor array substrate 100 comprises a thin film transistor, and the thin film transistor comprises the Low Temperature Poly-silicon layer 140, the isolation layer 150 and the metal layer 160, and the thin film transistor is a top gate thin film transistor or a bottom gate thin film transistor. The thin film transistor comprises a gate, a source and a drain. The gate is employed to receive a control signal, and the gate controls the source and the drain to be on or off under control of the control signal. When the gate controls the source and the drain to be on under control of the control signal, the source and the drain are electrically coupled, and an electrical path between the source and the drain is formed, and the thin film transistor is activated. When the gate controls the source and the drain to be off under control of the control signal, the source and the drain are cut off, and no electrical path can be formed between the source and the drain, and the thin film transistor is off (i.e. deactivated).

The substrate 110 is transparent, and the substrate 110 can be but not be restricted to be a plastic substrate or a glass substrate. The substrate 110 comprises a first surface 110a and a second surface 110b which are oppositely located, and that the light shielding layer 120 is located on the surface of the substrate 110 can be that the light shielding layer 120 is located on the first surface 110a of the substrate 110, or can be that the light shielding layer 120 is located on the second surface 110b of the substrate 110. Next, it is illustrated that the shielding layer 120 is located on the first surface 110a of the substrate 110 for explanation.

The light shielding layer 120 is located at a middle part on a surface of the substrate 110, i.e. the light shielding layer 120 is located at the middle part on the first surface 110a of the substrate 110. The light shielding layer 120 is employed to prevent the light leakage toward the direction of the second surface 110b of the substrate 110 by the thin film transistor in the thin film transistor array substrate. In one embodiment, material of the light shielding layer 120 can be metal. The material of the light shielding layer 120 can be Mo but not limited thereto. A width of the light shielding layer 120 is larger than a width of the metal layer 160, and a width of the light shielding layer 120 is larger than or equal to a width of the through hole 151. The width of the through hole 151 is restricted by the smallest width manufactured according to the limitation of the photo stepper. The width of the light shielding layer 120 is larger than the width of the metal layer 160, and smaller than the widths of the data line, source at the through hole connection position mentioned in background. The width of the metal layer 160 is larger than or equal to a width of the through hole 151, and smaller than the widths of the data line, source at the through hole connection position mentioned in background.

The buffer layer 130 is located between the light shielding layer 120 and the Low Temperature Poly-silicon layer 140, and employed to electrically isolate the light shielding layer 120 and the Low Temperature Poly-silicon layer 140. The buffer layer 130 is also employed to buffer the damage to the substrate 110 during the manufacture process of the thin film transistor array substrate 100.

The Low Temperature Poly-silicon layer 140 is located on the buffer layer 130, and corresponds to the light shielding layer 120. Here, the correspondence of the Low Temperature Poly-silicon layer 140 and the light shielding layer 120 refers to that the projection of the Low Temperature Poly-silicon layer 140 on the first surface 110a of the substrate 110 falls in the projection of the light shielding layer 120 on the first surface 110a of the substrate 110. For convenience, the projection of the Low Temperature Poly-silicon layer 140 on the first surface 110a of the substrate 110 is named to be a first projection, and the projection of the light shielding layer 120 on the first surface 110a of the substrate 110 is named to be a second projection. In one embodiment, the first projection falls in the second projection, and the center of the first projection coincides with the center of the second projection. In other embodiment, the first projection falls in the second projection, and the center of the first projection does not coincide with the center of the second projection, and the edge of the first projection and the edge of the second projection do not coincide. In other embodiment, the first projection falls in the second projection, and the center of the first projection does not coincide with the center of the second projection, and the edge of the first projection and the edge of the second projection partially coincide.

The isolation layer 150 is a gate isolation layer. The material of the isolation layer 150 can be oxide of silicon (such as $SiO_2$), nitrogen and silicon compounds (SiNx, wherein x is a natural number of nitrogen which can form the nitrogen and silicon compound, and x can be 4 for example) and etc.

The metal layer 160 is located on the isolation layer 150, and the metal layer 160 is connected with the Low Temperature Poly-silicon layer 140 via the through hole 151. The metal layer 160 comprises a data line 161 and a source 162 connected to the data line 161, and widths at respective positions of the metal layer are equal, and a part of the source 162 is located close to the data line 161 in accordance with the through hole 151, and is connected to the Low Temperature Poly-silicon layer 140 via the through hole 151.

The thin film transistor array substrate 100 further comprises a flat layer 170, a first transparent conductive layer 180a, a passivation layer 190 and a second transparent conductive layer 180b. The flat layer 170 covers the metal layer 160, and the first transparent conductive layer 180a covers the flat layer 170, and the passivation layer 190 covers the first transparent conductive layer 180a, and the second transparent conductive layer 180b covers the passivation layer 190. In one embodiment, the flat layer 170 is an organic flat layer, and the first transparent conductive layer 180a can be Indium Tin Oxide (ITO) but not limited thereto, and the second transparent conductive layer 180b can be Indium Tin Oxide (ITO) but not limited thereto, and material of the passivation layer 190 can be oxide of silicon (such as $SiO_2$), nitrogen and silicon compounds, and etc. In one embodiment, the first transparent conductive layer 180a is a pixel electrode, and the second transparent conductive layer 180b is a common electrode layer.

Compared with prior art, in thin film transistor array substrate 100 of the liquid crystal display 10 of the present invention, one light shielding layer 120 is located at the center on the surface of the substrate 110, and the Low Temperature Poly-silicon layer 140 is located corresponding to the light shielding layer 120 through one buffer layer 130, and the isolation layer 150 covers the Low Temperature Poly-silicon layer 140 and the isolation layer 150 comprises the through hole 151, and the width of the through hole 151 is smaller than the width of the light shielding layer 120, and the metal layer 160 is located on the isolation layer 150, and the metal layer 160 is connected with the Low Temperature Poly-silicon layer 140 via the through hole 140. Thus, the light shielding layer 120 is located on the surface of the substrate 110 in the thin film transistor array substrate 100 of the present invention, and the light shielding layer 120 is isolated from the Low Temperature Poly-silicon layer 140 and the metal layer 160 with the buffer layer 130. Therefore, the arrangement of the light shielding layer 120 does not cause the electrical field effect, and does not influence the leading direction of the liquid crystals. Accordingly, it is beneficial for promoting the aperture ratio of the liquid crystal display 10 applied with the thin film transistor array substrate 100. Furthermore, because the thin film transistor array substrate 100 of the present invention does not influence the leading direction of the liquid crystals, a wider black matrix layer located on the color filter substrate is not required for shielding in the thin film transistor array substrate 100 of the present invention, and the aperture ratio of the liquid crystal display 10 applied with the thin film transistor array substrate 100 can be promoted in advance.

Above are embodiments of the present invention, which does not limit the scope of the present invention. Any modifications, equivalent replacements or improvements within the spirit and principles of the embodiment described above should be covered by the protected scope of the invention.

What is claimed is:

1. A thin film transistor array substrate, wherein the thin film transistor array substrate comprises:
   a substrate;
   a light shielding layer, located at a middle part on a surface of the substrate;
   a buffer layer, covering the light shielding layer;
   a Low Temperature Poly-silicon layer, being located on the buffer layer, and corresponding to the light shielding layer;
   an isolation layer, covering the Low Temperature Poly-silicon layer, and the isolation layer comprises a through hole, wherein a width of the through hole is smaller than a width of the light shielding layer;

a metal layer, located on the isolation layer, and the metal layer is connected with the Low Temperature Poly-silicon layer via the through hole;

wherein the metal layer comprises a data line and a source connected to the data line, and widths at respective positions of the metal layer are equal, and a part of the source is located close to the data line in accordance with the through hole, and is connected to the Low Temperature Poly-silicon layer via the through hole.

2. The thin film transistor array substrate according to claim 1, wherein the isolation layer is a gate isolation layer.

3. The thin film transistor array substrate according to claim 1, wherein a width of the light shielding layer is larger than a width of the metal layer, and a width of the light shielding layer is larger than or equal to a width of the through hole.

4. The thin film transistor array substrate according to claim 1, wherein material of the light shielding layer is metal.

5. The thin film transistor array substrate according to claim 4, wherein material of the light shielding material comprises Mo.

6. The thin film transistor array substrate according to claim 1, wherein the thin film transistor array substrate comprises a thin film transistor, and the thin film transistor comprises the Low Temperature Poly-silicon layer, the isolation layer and the metal layer, and the thin film transistor is a top gate thin film transistor or a bottom gate thin film transistor.

7. The thin film transistor array substrate according to claim 1, wherein the thin film transistor array substrate further comprises:
a flat layer, covering the metal layer;
a first transparent conductive layer, covering the flat layer;
a passivation layer, covering the first transparent conductive layer;
a second transparent conductive layer, covering the passivation layer.

8. The thin film transistor array substrate according to claim 7, wherein the first transparent conductive layer is a pixel electrode, and the second transparent conductive layer is a common electrode layer.

9. A liquid crystal display, wherein the liquid crystal display comprises a thin film transistor array substrate, wherein the thin film transistor array substrate comprises:
a substrate;
a light shielding layer, located at a middle part on a surface of the substrate;
a buffer layer, covering the light shielding layer;
a Low Temperature Poly-silicon layer, being located on the buffer layer, and corresponding to the light shielding layer;
an isolation layer, covering the Low Temperature Poly-silicon layer, and the isolation layer comprises a through hole, wherein a width of the through hole is smaller than a width of the light shielding layer;
a metal layer, located on the isolation layer, and the metal layer is connected with the Low Temperature Poly-silicon layer via the through hole;
wherein the metal layer comprises a data line and a source connected to the data line, and widths at respective positions of the metal layer are equal, and a part of the source is located close to the data line in accordance with the through hole, and is connected to the Low Temperature Poly-silicon layer via the through hole.

10. The liquid crystal display according to claim 9, wherein the isolation layer is a gate isolation layer.

11. The liquid crystal display according to claim 9, wherein a width of the light shielding layer is larger than a width of the metal layer, and a width of the light shielding layer is larger than or equal to a width of the through hole.

12. The liquid crystal display according to claim 9, wherein material of the light shielding layer is metal.

13. The liquid crystal display according to claim 12, wherein material of the light shielding material comprises Mo.

14. The liquid crystal display according to claim 9, wherein the thin film transistor array substrate comprises a thin film transistor, and the thin film transistor comprises the Low Temperature Poly-silicon layer, the isolation layer and the metal layer, and the thin film transistor is a top gate thin film transistor or a bottom gate thin film transistor.

15. The liquid crystal display according to claim 9, wherein the thin film transistor array substrate further comprises:
a flat layer, covering the metal layer;
a first transparent conductive layer, covering the flat layer;
a passivation layer, covering the first transparent conductive layer;
a second transparent conductive layer, covering the passivation layer.

16. The liquid crystal display according to claim 15, wherein the first transparent conductive layer is a pixel electrode, and the second transparent conductive layer is a common electrode layer.

17. A thin film transistor array substrate, wherein the thin film transistor array substrate comprises:
a substrate;
a light shielding layer, located at a middle part on a surface of the substrate;
a buffer layer, covering the light shielding layer;
a Low Temperature Poly-silicon layer, being located on the buffer layer, and corresponding to the light shielding layer;
an isolation layer, covering the Low Temperature Poly-silicon layer, and the isolation layer comprises a through hole, wherein a width of the through hole is smaller than a width of the light shielding layer;
a metal layer, located on the isolation layer, and the metal layer is connected with the Low Temperature Poly-silicon layer via the through hole;
wherein the thin film transistor array substrate further comprises:
a flat layer, covering the metal layer;
a first transparent conductive layer, covering the flat layer;
a passivation layer, covering the first transparent conductive layer;
a second transparent conductive layer, covering the passivation layer.

18. The thin film transistor array substrate according to claim 17, wherein the first transparent conductive layer is a pixel electrode, and the second transparent conductive layer is a common electrode layer.

* * * * *